(12) United States Patent  
Imai

(10) Patent No.: US 8,659,150 B2
(45) Date of Patent: Feb. 25, 2014

(54) SEMICONDUCTOR MODULE

(75) Inventor: Makoto Imai, Toyota (JP)

(73) Assignee: Toyota Jidosha Kabushiki Kaisha, Toyota-Shi (JP)

( * ) Notice: Subject to any disclaimer, the term of this patent is extended or adjusted under 35 U.S.C. 154(b) by 0 days.

(21) Appl. No.: 13/554,254

(22) Filed: Jul. 20, 2012

(65) Prior Publication Data

US 2013/0062749 A1   Mar. 14, 2013

Related U.S. Application Data

(63) Continuation of application No. PCT/JP2011/070810, filed on Sep. 13, 2011.

(51) Int. Cl.
*H01L 23/48* (2006.01)

(52) U.S. Cl.
USPC ........................................................ 257/727

(58) Field of Classification Search
USPC ......... 257/690, 691, 698, 712, 717, 718, 719, 257/727, 739, 785, E23.078, E23.141, 257/E23.169
See application file for complete search history.

(56) References Cited

U.S. PATENT DOCUMENTS

| | | | |
|---|---|---|---|
| 1,341,771 A | | 6/1920 | Allender |
| 3,825,804 A | * | 7/1974 | Amelunxen .................... 257/727 |
| 4,069,497 A | * | 1/1978 | Steidlitz ........................ 257/705 |
| 4,126,883 A | * | 11/1978 | Martin ........................... 257/718 |
| 4,587,550 A | * | 5/1986 | Matsuda ........................ 257/689 |
| 4,609,937 A | * | 9/1986 | Takeuchi et al. ............... 257/785 |
| 4,642,671 A | * | 2/1987 | Rohsler et al. ................. 257/712 |
| 4,673,961 A | * | 6/1987 | Nishizawa et al. ............ 257/181 |
| 4,694,322 A | * | 9/1987 | Sakurai et al. ................. 257/785 |
| 4,769,744 A | * | 9/1988 | Neugebauer et al. .......... 361/717 |
| 5,057,877 A | * | 10/1991 | Briley et al. ................... 505/191 |
| 5,305,185 A | * | 4/1994 | Samarov et al. ............... 361/704 |
| 5,315,481 A | * | 5/1994 | Smolley ......................... 361/707 |

(Continued)

FOREIGN PATENT DOCUMENTS

| | | |
|---|---|---|
| JP | 2-015643 A | 1/1990 |
| JP | 09-252067 A | 9/1997 |

(Continued)

OTHER PUBLICATIONS

JIPO Written Amendment (machine translation) for application JP2012-518686 on Jun. 24, 2013, pp. 1-2.*

(Continued)

*Primary Examiner* — Michele Fan
(74) *Attorney, Agent, or Firm* — Kenyon & Kenyon LLP

(57) ABSTRACT

A semiconductor module that can be connected with simple wiring is provided. A semiconductor device of the semiconductor module is provided with a semiconductor substrate, a first electrode formed on one surface of the semiconductor substrate, and a second electrode formed on a surface of the semiconductor substrate opposite to the one surface. The semiconductor module is provided with a first electrode plate being in contact with the first electrode, a second electrode plate being in contact with the second electrode, and a first wiring member connected to the second electrode plate and penetrating the first electrode plate in a state of being insulated from the first electrode plate. The first electrode plate, the semiconductor device, and the second electrode plate are fixed with each other by an application of a pressure pressurizing the semiconductor device on the first electrode plate and the second electrode plate.

3 Claims, 5 Drawing Sheets

(56) References Cited

U.S. PATENT DOCUMENTS

| | | | | |
|---|---|---|---|---|
| 5,346,859 A * | 9/1994 | Niwayama | ...................... | 29/854 |
| 5,436,473 A * | 7/1995 | Passerini et al. | .............. | 257/177 |
| 5,523,586 A * | 6/1996 | Sakurai | ........................... | 257/48 |
| 5,739,556 A * | 4/1998 | Bolgiani | ...................... | 257/182 |
| 5,770,891 A * | 6/1998 | Frankeny et al. | ............. | 257/727 |
| 5,793,618 A * | 8/1998 | Chan et al. | .................... | 361/809 |
| 5,866,944 A | 2/1999 | Hiyoshi et al. | | |
| 5,920,120 A * | 7/1999 | Webb et al. | .................... | 257/719 |
| 5,933,327 A * | 8/1999 | Leighton et al. | ............. | 361/719 |
| 5,945,736 A * | 8/1999 | Rife et al. | ..................... | 257/719 |
| 6,058,014 A * | 5/2000 | Choudhury et al. | .......... | 361/704 |
| 6,160,710 A * | 12/2000 | Ahl et al. | ...................... | 361/707 |
| 6,181,006 B1 * | 1/2001 | Ahl et al. | ...................... | 257/712 |
| 6,256,202 B1 * | 7/2001 | Murphy | ........................ | 361/704 |
| 6,320,268 B1 * | 11/2001 | Lang et al. | .................... | 257/785 |
| 6,349,032 B1 * | 2/2002 | Chan et al. | .................... | 361/704 |
| 6,354,859 B1 * | 3/2002 | Barabi et al. | ................. | 439/331 |
| 6,380,622 B1 | 4/2002 | Hirai et al. | | |
| 6,490,161 B1 * | 12/2002 | Johnson | ....................... | 361/704 |
| 6,677,673 B1 * | 1/2004 | Hitchcock | .................... | 257/718 |
| 6,750,551 B1 * | 6/2004 | Frutschy et al. | ............. | 257/785 |
| 6,791,170 B1 * | 9/2004 | Fuku et al. | .................... | 257/678 |
| 6,977,434 B2 * | 12/2005 | Martino | ........................ | 257/727 |
| 6,988,533 B2 * | 1/2006 | Colbert et al. | ............... | 165/80.3 |
| 7,005,739 B2 * | 2/2006 | Kaufmann et al. | ........... | 257/719 |
| 7,279,788 B2 * | 10/2007 | Canella | ......................... | 257/692 |
| 7,358,106 B2 * | 4/2008 | Potter | ............................. | 438/51 |
| 7,534,979 B2 | 5/2009 | Ito et al. | | |
| 7,554,186 B2 * | 6/2009 | Kudo et al. | ................... | 257/686 |
| 8,238,103 B2 * | 8/2012 | Urai | .............................. | 361/710 |
| 2002/0017717 A1 * | 2/2002 | Gruning | ........................ | 257/718 |
| 2002/0036339 A1 * | 3/2002 | Taguchi et al. | ................ | 257/690 |
| 2002/0056922 A1 * | 5/2002 | Funaya et al. | ................. | 257/778 |
| 2002/0080588 A1 * | 6/2002 | Eldridge et al. | .............. | 361/776 |
| 2002/0180037 A1 * | 12/2002 | Shirakawa et al. | ........... | 257/727 |
| 2004/0058470 A1 * | 3/2004 | Canella | ......................... | 438/106 |
| 2004/0242031 A1 * | 12/2004 | Gobl et al. | ....................... | 439/73 |
| 2005/0164416 A1 * | 7/2005 | Ondricek et al. | ............. | 438/17 |
| 2005/0164534 A1 * | 7/2005 | Li | .................................. | 439/108 |
| 2009/0236721 A1 * | 9/2009 | Meguro | ........................ | 257/686 |
| 2010/0252922 A1 * | 10/2010 | Bayerer et al. | ................ | 257/692 |

FOREIGN PATENT DOCUMENTS

| | | |
|---|---|---|
| JP | 2001-102400 A | 4/2001 |
| JP | 2002-057263 A | 2/2002 |
| JP | 2009-013800 A | 1/2009 |

OTHER PUBLICATIONS

JIPO Decision to Grant a Patent (machine translation) for application JP2012-518686 on Jul. 9, 2013, pp. 1-2.*

JIPO Drawings figs. 1-8 for application JP2012-518686 on Apr. 25, 2012, pp. 1-5.*

International Search Report mailed Nov. 29, 2011 of PCT/JP2011/070810.

News Release of Denso Corporation, May 23, 2007, "Denso develops high output power control unit and battery cooling system".

Notice of Allowance in related U.S. Appl. No. 13/611,568, mailed Jul 9, 2013.

U.S. Appl. No. 13/613,646, Office Action mailed Sep. 10, 2013.

* cited by examiner

SEMICONDUCTOR MODULE

CROSS-REFERENCE TO RELATED APPLICATIONS

This is a Continuation of International Application No. PCT/JP2011/070810 filed on Sep. 13, 2011, the disclosure of which is hereby incorporated by reference herein in its entirety.

TECHNICAL FIELD

The technique disclosed in the present specification relates to a semiconductor module.

BACKGROUND ART

When a semiconductor device generates heat, the heat causes the semiconductor device and peripheral members thereof (solder, wiring, and the like) to thermally expand. Due to differences in coefficients of thermal expansion among the respective members, stress acts on the semiconductor device. Such stress reduces semiconductor device life.

SUMMARY

Technical Problem

In order to reduce the aforementioned stress, connection of a semiconductor device to wirings that do not involve joining with a brazing material such as solder has been under consideration. For example, Japanese Patent Application Publication No. H9-252067 (hereinafter, referred to as a patent document 1) discloses a semiconductor module in which a semiconductor device and respective electrode plates are stacked and pressurized in order to connect the semiconductor device and the respective electrode plates to each other. However, with this semiconductor module, a positive plate is arranged on a lower surface of the semiconductor module and a negative plate is arranged on an upper surface of the semiconductor module. Therefore, when installing the semiconductor module to equipment, wirings must be respectively connected to an upper surface side (in other words, a negative plate side) of the semiconductor module and to a lower surface side (in other words, a positive plate side) of the semiconductor module. In other words, complicated wiring is required to install the semiconductor module to a device. In consideration thereof, the present specification provides a semiconductor module that can be installed to a device using simpler wiring.

Solution to Problem

A semiconductor module disclosed in the present specification includes a semiconductor device, a first electrode plate, a second electrode plate, and a first wiring member. The semiconductor device includes a semiconductor substrate, a first electrode formed on one surface of the semiconductor substrate, and a second electrode formed on a surface of the semiconductor substrate opposite to the one surface. The first electrode plate is in contact with the first electrode. The second electrode plate is in contact with the second electrode. The first wiring member is connected to the second electrode plate and penetrates the first electrode plate in a state of being insulated from the first electrode plate. The first electrode plate, the semiconductor device, and the second electrode plate are fixed with each other by an application of a pressure pressurizing the semiconductor device on the first electrode plate and the second electrode plate.

In this semiconductor module, the first electrode plate, the semiconductor device, and the second electrode plate are connected to each other by an application of a pressure. Since the semiconductor module does not use joining by a brazing material, stress is less likely to act on the semiconductor device when heat is being generated by the semiconductor device. In addition, the second electrode plate is connected to the first wiring member that penetrates the first electrode plate. Therefore, in addition to a wiring to the first electrode plate, a wiring to the second electrode plate can also be provided on the first electrode plate side. As a result, when installing the semiconductor module to equipment, the semiconductor module can be connected by simpler wirings.

DESCRIPTION OF EMBODIMENTS

The semiconductor module described in this specification may further include: a cylinder encompassing the semiconductor device and the second electrode plate and fixed to the first electrode plate, a first thread groove being formed on one of an outer peripheral surface or an inner peripheral surface of the cylinder; and a cover on which a second thread groove is formed, the cover being fixed to the cylinder by an engagement of the first thread groove and the second thread groove, and the cover pressurizing the second electrode plate to the semiconductor device.

Moreover, the cover may pressurize the second electrode plate to the semiconductor device while being directly in contact with the second electrode plate, or may pressurize the second electrode plate to the semiconductor device via another member.

With this semiconductor module, the cover and the cylinder can be assembled by rotating the cover and causing the second thread groove to engage the first thread groove. Since the wiring to the second electrode plate penetrates the first electrode plate and is extracted to the outside by the first wiring member, the wiring to the second electrode through the cover need not be provided. Therefore, even when an assembly system involving rotating the cover is adopted, wiring members do not interfere with the rotation of the cover. In addition, according to such a construction, by rotating the cover, the second electrode plate can be pressurized to the semiconductor device by the cover. In other words, by installing the cover to the cylinder, the first electrode plate, the semiconductor device, and the second electrode plate can be fixed with each other. Therefore, the semiconductor module can be assembled with ease.

In the semiconductor module described above, a cooler may be fixed to the cover.

As described earlier, since the wiring need not be provided on the cover, the cover and the cooler can be connected to each other in a preferable manner. Therefore, the semiconductor device can be cooled in a preferable manner.

In the semiconductor module described above, the semiconductor device may includes a third electrode formed on the one surface of the semiconductor substrate, and the semiconductor module may further include a second wiring member connected to the third electrode and penetrating the first electrode plate in a state of being insulated from the first electrode plate.

According to such a construction, the wiring to the third electrode can be extracted to the side of the first electrode plate. Therefore, the wiring to the third electrode can be provided on the side of the first electrode plate.

(First Embodiment)

Figure 1:
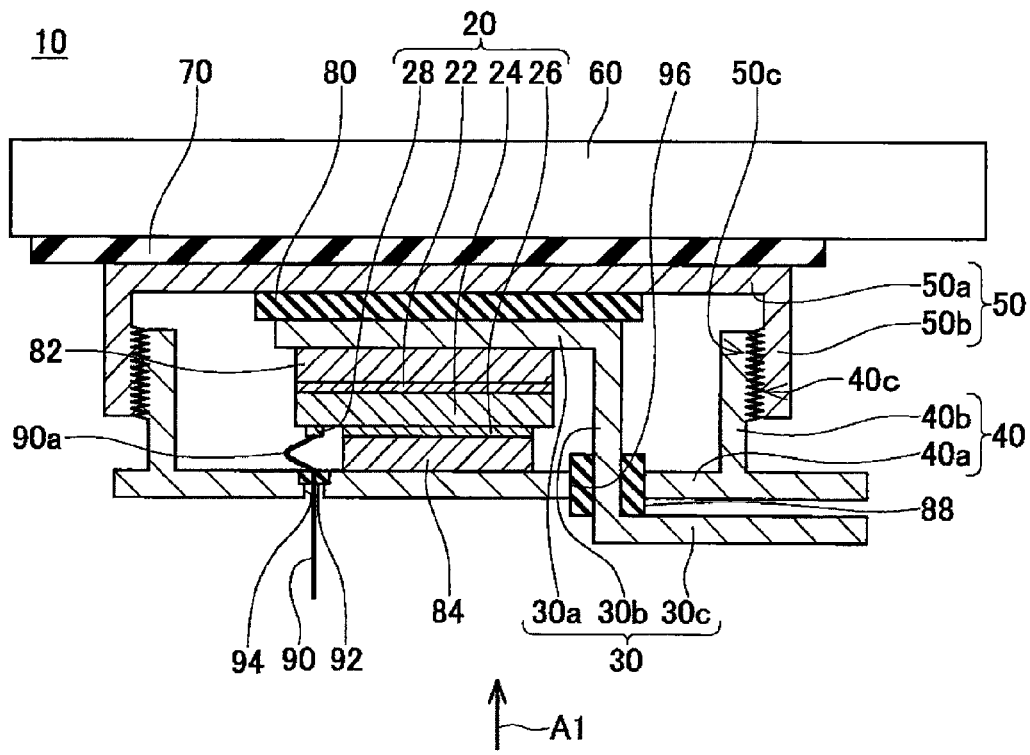
FIG. 1 is a schematic cross-sectional view of a semiconductor module 10 according to a first embodiment.

A semiconductor module 10 shown in FIG. 1 is an assembly in which a semiconductor device 20 is housed in a case 40 and a cover 50.

Figure 2:
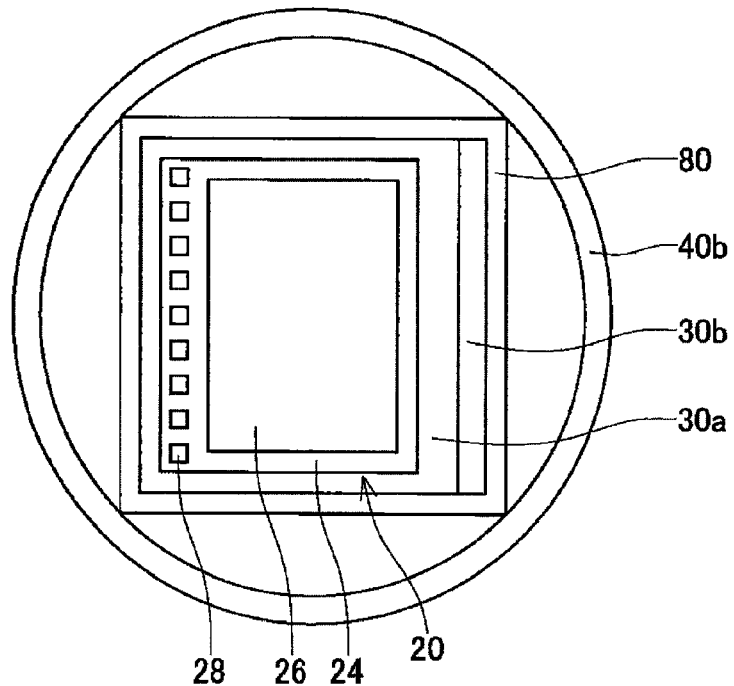
FIG. 2 is a diagram showing a positional relationship among a semiconductor device 20, a fiat plate portion 30a and a penetrating wiring portion 30b of a bus bar 30, an insulating plate 80, and a cylindrical portion 40b of a first electrode plate 40 when the semiconductor module 10 is viewed along an arrow A1 in FIG. 1.

The case 40 is constructed of metal. The case 40 includes a flat plate portion 40a and a cylindrical portion 40b. The flat plate portion 40a is formed in an approximately planar shape. As shown in FIGS. 1 and 2, the cylindrical portion 40b is formed in a circular cylindrical shape with a central axis extending perpendicular to the flat plate portion 40a. The cylindrical portion 40b is fixed on the flat plate portion 40a. A thread groove 40c is formed on an outer peripheral surface of the cylindrical portion 40b.

A metal plate 84, the semiconductor device 20, a metal plate 82, a bus bar 30, an insulating plate 80, and a pin 90 are installed on the flat plate portion 40a within the cylindrical portion 40b.

The metal plate 84 is installed on the flat plate portion 40a. The metal plate 84 is constructed of a relatively soft metal such as tin.

The semiconductor device 20 is installed on the metal plate 84. The semiconductor device 20 includes a semiconductor substrate 24 constructed of SiC. A MOSFET is formed in the semiconductor substrate 24. A source electrode 26 of the MOSFET and a plurality of gate electrodes 28 of the MOSFET are formed on a lower surface of the semiconductor substrate 24. As shown in FIG. 2, the semiconductor substrate 24 has a rectangular shape. The plurality of gate electrodes 28 is arranged along one long side of the semiconductor substrate 24. As shown in FIG. 1, a drain electrode 22 of the MOSFET is formed on an upper surface of the semiconductor substrate 24. The semiconductor device 20 is installed on the metal plate 84 so that the source electrode 26 comes into contact with the metal plate 84. The respective gate electrodes 28 are not in contact with the metal plate 84.

A through hole 94 that penetrates the flat plate portion 40a of the case 40 from an upper surface to a lower surface of the flat plate portion 40a is formed in the flat plate portion 40a at a position opposing the gate electrodes 28 of the semiconductor device 20. The through hole 94 extends along a direction in which the plurality of gate electrodes 28 is arranged. Specifically, a single through hole 94 having an approximately rectangular shape in a plan view is formed in the flat plate portion 40a so as to oppose all of the gate electrodes 28. An insulating member 92 is fixed inside the through hole 94. The insulating member 92 is constructed by a resin material such as PPS. The through hole 94 is blocked by the insulating member 92. Metallic pins 90 are fixed to the insulating member 92 at locations that oppose the gate electrodes 28. Moreover, although only one pin 90 is shown in FIG. 1, a pin 90 is fixed to each position that opposes each gate electrode 28. In other words, the plurality of pins 90 is fixed to the insulating member 92. Each pin 90 penetrates the insulating member 92. Consequently, an upper end of each pin 90 is positioned on an upper side of the flat plate portion 40a, and a lower end of each pin 90 is positioned on a lower side of the flat plate portion 40a. A portion 90a of each pin 90 on the upper side of the flat plate portion 40a is a spring portion that deforms elastically. Each spring portion 90a is in contact with a corresponding gate electrode 28 in a bent state. Each pin 90 is insulated from the flat plate portion 40a of the case 40 by the insulating member 92.

The metal plate 82 is installed on the semiconductor device 20. The metal plate 82 is constructed of a relatively soft metal such as tin.

The bus bar 30 is a component constructed by bending a metallic flat plate. The bus bar 30 includes a flat plate portion 30a, a penetrating wiring portion 30b, and an outer wiring portion 30c. The flat plate portion 30a is formed in an approximately planar shape and is installed on the metal plate 82. The penetrating wiring portion 30b extends downward from the flat plate portion 30a. A through hole 96 is formed in the flat plate portion 40a of the case 40 at a position not opposing the semiconductor device 20. The penetrating wiring portion 30b extends through the through hole 96 to the lower side of the flat plate portion 40a. An insulating member 88 is fixed inside the through hole 96. The insulating member 88 blocks the through hole 96. The penetrating wiring portion 30b is fixed to the insulating member 88 and is insulated from the flat plate portion 40a by the insulating member 88. The outer wiring portion 30c extends sideways from a lower end of the penetrating wiring portion 30b. The outer wiring portion 30c extends parallel to the flat plate portion 40a on the lower side of the flat plate portion 40a.

The insulating plate 80 is installed on the flat plate portion 30a of the bus bar 30. The insulating plate 80 is constructed of an insulator such as AlN.

The cover 50 is constructed of metal. An insulation coating is applied to an outer surface of the cover 50. The cover 50 includes a side wall portion 50b formed into a circular cylindrically shape and a flat plate portion 50a that blocks one end of a central hole of the circular cylindrical shape. In other words, the cover 50 is shaped like a cup. A thread groove 50c is formed on an inner peripheral surface of the side wall portion 50b. The thread groove 50c of the cover 50 engages the thread groove 40c of the case 40. In other words, the cover 50 is fastened to the case 40 using the thread grooves 40c and 50c. A lower surface of the flat plate portion 50a of the cover 50 is in contact with the insulating plate 80. More specifically, the flat plate portion 50a of the cover 50 and the flat plate portion 40a of the case 40 sandwich a laminated body constituted by the metal plate 84, the semiconductor device 20, the metal plate 82, the bus bar 30, and the insulating plate 80. The cover 50 is fastened at a high torque to the case 40. As a result, the laminated body is pressurized by the flat plate portion 50a and the flat plate portion 40a. Due to the pressure, respective members constituting the laminated body are fixed with each other. Moreover, a contact portion of the flat plate portion 40a of the case 40 and the metal plate 84, a contact portion of the metal plate 84 and the source electrode 26 of the semiconductor device 20, a contact portion of the drain electrode 22 of the semiconductor device 20 and the metal plate 82, a contact portion of the metal plate 82 and the flat plate portion 30a of the bus bar 30, and a contact portion of the respective pin 90 and the corresponding gate electrode 28 of the semiconductor device 20 are not joined by a brazing material such as solder. Therefore, when the cover 50 is detached from the case 40, the respective members of the laminated body can be separated from each other.

An insulating sheet 70 is installed on an upper surface of the flat plate portion 50a of the cover 50. A cooler 60 is installed on an upper surface of the insulating sheet 70. The cooler 60 is a liquid circulation-type cooler. Moreover, grease is applied to a contact portion of the cover 50 and the insulating sheet 70 and to a contact portion of the insulating sheet 70 and the cooler 60. Consequently, thermal resistance between the cooler 60 and the cover 50 is reduced.

As described above, in the semiconductor module 10, the wiring to the source electrode 26 positioned on the lower surface side of the semiconductor substrate 24 is constituted by the flat plate portion 40a of the case 40. In addition, the bus bar 30 that is the wiring to the drain electrode 22 positioned on the upper surface side of the semiconductor substrate 24 penetrates the flat plate portion 40a of the case 40 and is extracted to the lower side of the flat plate portion 40a. Furthermore, the pins 90 that are the wirings to the gate electrodes 28 penetrate the flat plate portion 40a of the case 40 and are extracted to the lower side of the flat plate portion 40a. Therefore, an external wiring to the flat plate portion 40a (in other words, the source electrode 26), an external wiring to the bus bar 30 (in other words, the drain electrode 22), and external wirings to the pins 90 (in other words, the gate electrodes 28) can be installed on the lower surface side of the semiconductor module 10. As a result, the external wirings are not installed on the upper surface of the cover 50. Since no external wirings exist on the upper surface of the cover 50, an entirety of the upper surface of the cover 50 can be connected to the cooler 60 via the insulating sheet 70. Consequently, the semiconductor device 20 can be cooled by the cooler 60 in a preferable manner. In addition, by organizing the wirings to the respective electrodes on the lower surface side of the semiconductor module 10 in this manner, inductances among the wirings can be reduced. Furthermore, in the semiconductor module 10, the semiconductor device 20 is fixed to peripheral members thereof by pressure, and the semiconductor device 20 and the peripheral members thereof are not joined with each other by brazing or the like. Therefore, when the semiconductor device 20 and the peripheral members thereof thermally expand due to heat generated by the semiconductor device 20, stress is less likely to act on the semiconductor device 20. Consequently, the semiconductor module 10 has a long life.

In addition, in the semiconductor module 10, the semiconductor device 20 has a rectangular planar shape as shown in FIG. 2. Furthermore, the plurality of gate electrodes 28 is arranged along one long side of the semiconductor device 20. Moreover, the penetrating wiring portion 30b of the bus bar 30 penetrates the flat plate portion 40a of the case 40 in a vicinity of an opposite long side of the semiconductor device 20. According to such an arrangement, as shown in FIG. 2, the bus bar 30 inside the cylindrical portion 40b can be given an approximately square planar shape and an internal region of the cylindrical portion 40b can be utilized more widely.

Figure 3:
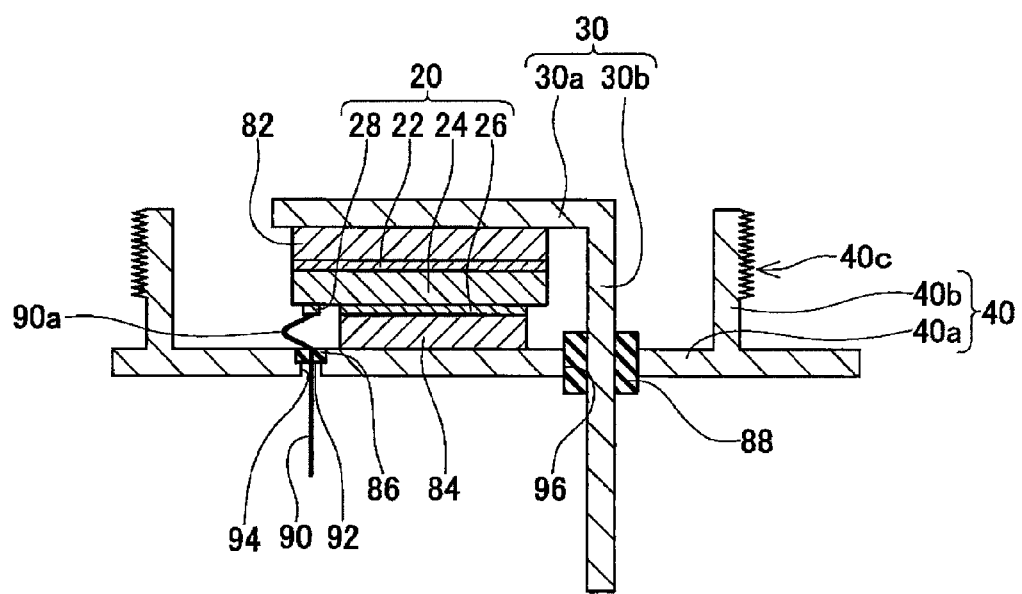
FIG. 3 is an explanatory drawing of an assembly process of the semiconductor module 10.

Next, a method of manufacturing the semiconductor module 10 will be described. First, the metal plate 84 is placed on the flat plate portion 40a of the case 40. A component that integrates the plurality of the pins 90 and the insulating member 92 is then installed in the through hole 94 of the flat plate portion 40a. The semiconductor device 20 is then placed on the metal plate 84. In doing so, the source electrode 26 is brought into contact with the metal plate 84, and the respective gate electrodes 28 are brought into contact with corresponding pins 90. The metal plate 82 is placed on the semiconductor device 20. Subsequently, as shown in FIG. 3, a component that integrates the bus bar 30 and the insulating member 88 is installed. At this stage, the bus bar 30 has an L-shape cross section and the outer wiring portion 30c (a portion bent from a lower side of the insulating member 88) shown in FIG. 1 is not yet formed. At this point, the penetrating wiring portion 30b of the bus bar 30 is inserted into the through hole 96 of the case 40 until the insulating member 88 is installed inside the through hole 96. In addition, the flat plate portion 30a of the bus bar 30 is brought into contact with the metal plate 82. The insulating plate 80 is then placed on the flat plate portion 30a of the bus bar 30. Next, by causing the thread groove 50c of the cover 50 to engage with the thread groove 40c of the case 40, the cover 50 is fixed to the case 40. When the cover 50 is moved downward by rotating the cover 50 around a central axis thereof, the flat plate portion 50a of the cover 50 comes into contact with the insulating plate 80. By further rotating the cover 50 from this state, the flat plate portion 50a of the cover 50 pressurizes the insulating plate 80 to the semiconductor device 20. As a result, the laminated body (in other words, the metal plate 84, the semiconductor device 20, the metal plate 82, the flat plate portion 30a of the bus bar 30, and the insulating plate 80) sandwiched between the flat plate portion 50a of the cover 50 and the flat plate portion 40a of the case 40 is pressurized in a lamination direction. Accordingly, respective members of the laminated body are fixed with each other.

Moreover, the metal plate 84 is softer than the source electrode 26 and the flat plate portion 40a of the case 40 that are adjacent to the metal plate 84. Therefore, when the laminated body is pressurized, an upper surface of the metal plate 84 plastically deforms so as to conform to a surface shape of the source electrode 26 and the metal plate 84 comes into close contact with the source electrode 26. In a similar manner, when the laminated body is pressurized, a lower surface of the metal plate 84 plastically deforms so as to conform to a surface shape of the flat plate portion 40a and the metal plate 84 comes into close contact with the flat plate portion 40a. As a result, the source electrode 26 and the flat plate portion 40a are securely connected with each other.

In addition, the metal plate 82 is softer than the drain electrode 22 and the flat plate portion 30a of the bus bar 30 that are adjacent to the metal plate 82. Therefore, when the laminated body is pressurized, a lower surface of the metal plate 82 plastically deforms so as to conform to a surface shape of the drain electrode 22 and the metal plate 82 comes into close contact with the drain electrode 22. In a similar manner, when the laminated body is pressurized, an upper surface of the metal plate 82 plastically deforms so as to conform to a surface shape of the flat plate portion 30a and the metal plate 82 comes into close contact with the flat plate portion 30a. As a result, the drain electrode 22 and the flat plate portion 30a are securely connected with each other.

Furthermore, when the laminated body is pressurized, the spring portion 90a of the pin 90 deflects. As a result, an appropriate pressure is applied between the pin 90 and the gate electrode 28. Therefore the pin 90 and the gate electrode 28 are securely connected with each other.

Once the cover 50 is fixed to the case 40, a lower portion of the bus bar 30 is bent in order to form the outer wiring portion 30c. Subsequently, by attaching the cooler 60 to the cover 50 via the insulating sheet 70, the semiconductor module 10 shown in FIG. 1 is completed.

In the semiconductor module 10, the wiring to the semiconductor device 20 does not penetrate the cover 50. Therefore, the cover 50 can be freely rotated during assembly. As a result, the cover 50 can be attached to the case 40 by causing the thread groove 40c and the thread groove 50c to engage each other. In addition, this screw structure enables the cover 50 to pressurize the laminated body. Consequently, the semiconductor module 10 can be assembled with ease.

Moreover, in the semiconductor module 10 according to the first embodiment, the flat plate portion 40a of the case 40 and the metal plate 84 constitute a first electrode plate (an electrode plate in contact with the source electrode 26). In addition, the flat plate portion 30a of the bus bar 30 and the metal plate 82 constitute a second electrode plate (an electrode plate in contact with the drain electrode 22). Furthermore, the penetrating wiring portion 30b of the bus bar 30 constitutes a first wiring member (a wiring member connected to the second electrode plate and penetrates the first electrode plate in a state of being insulated from the first electrode plate). In addition, the cylindrical portion 40b of the case 40 constitutes a cylinder encompassing the semiconductor device and the second electrode plate, fixed to the first electrode plate, and having a first thread groove formed on an outer peripheral surface of the cylinder. Furthermore, the cover 50 constitutes a cover on which a second thread groove is formed, fixed to the cylinder by an engagement of the first thread groove and the second thread groove, and pressurizing the second electrode plate (via the insulating plate 80) to the semiconductor device. Moreover, the pin 90 constitutes a second wiring member connected to a third electrode (the gate electrode) and penetrating the first electrode plate in a state of being insulated from the first electrode plate.

Figure 4:
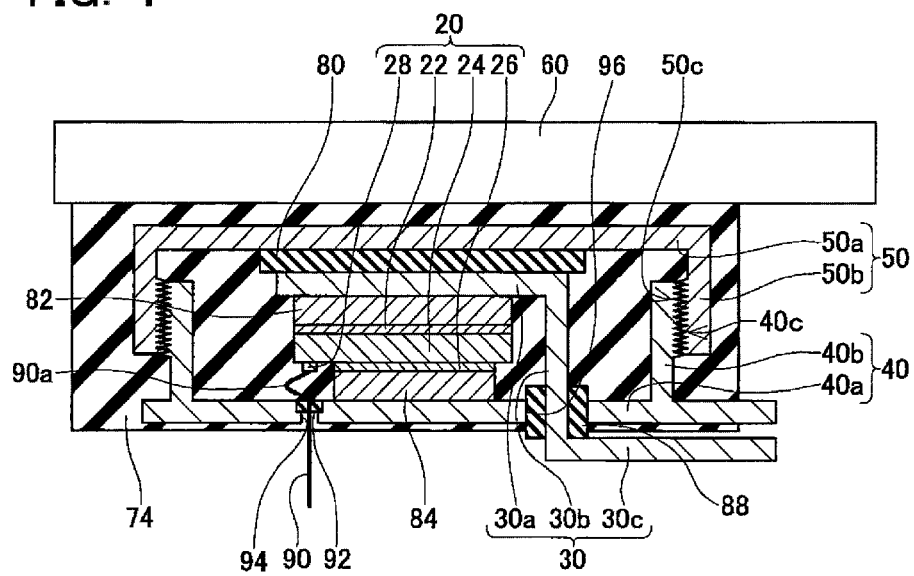
FIG. 4 is a schematic cross-sectional view of a semiconductor module according to a first modification of the first embodiment.
Figure 5:
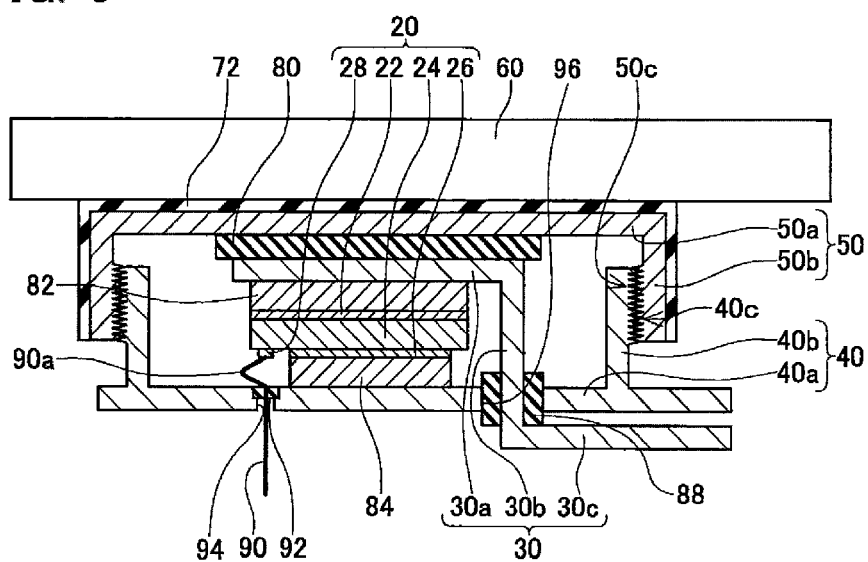
FIG. 5 is a schematic cross-sectional view of a semiconductor module according to a second modification of the first embodiment.
Figure 6:
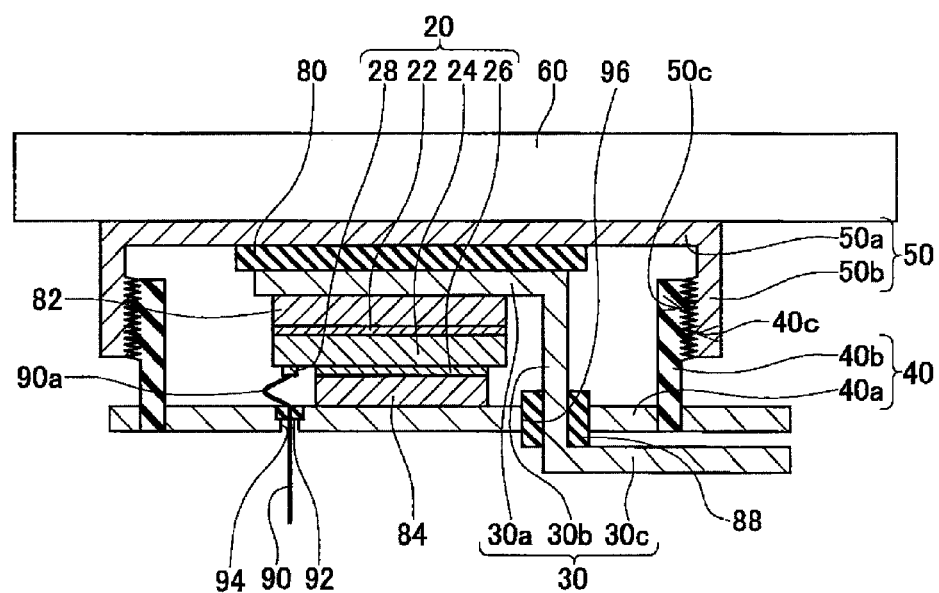
FIG. 6 is a schematic cross-sectional view of a semiconductor module according to a third modification of the first embodiment.

In the first embodiment, the cover 50 is fixed to the cooler 60 via the insulating sheet 70. However, alternatively, an insulating film may be formed on a surface of the cover 50 and the cover 50 may be fixed to the cooler 60 via the insulating film. In addition, as shown in FIG. 4, an entire periphery of the case 40 and the cover 50 may alternatively be covered by a resin 74 that is an insulator. In this case, a space surrounding the semiconductor device 20 (a space enclosed by the case 40 and the cover 50) may be filled with the resin 74 as shown in FIG. 4 or may not be filled with the resin. Furthermore, as shown in FIG. 5, an insulating cap 72 may alternatively be overlaid on the cover 50 and the cover 50 may be fixed to the cooler 60 via the cap 72. In addition, while the flat plate portion 40a and the cylindrical portion 40b are integrated in the first embodiment, the flat plate portion 40a and the cylindrical portion 40b may alternatively be constituted by separate members. For example, as shown in FIG. 6, a cylinder 40b constructed of an insulator may be fixed to a metallic flat plate 40a. Note that, in FIGS. 4 to 6, members configured similarly to those of the first embodiment are denoted by the same reference characters as in the first embodiment.

In addition, while the semiconductor module 10 according to the first embodiment includes the metal plate 84, alternatively, the metal plate 84 may be absent and the source electrode 26 may come into direct contact with the flat plate portion 40a. Furthermore, while the semiconductor module 10 according to the first embodiment includes the metal plate 82, alternatively, the metal plate 82 may be absent and the drain electrode 22 may come into direct contact with the flat plate portion 30a. Moreover, the semiconductor module 10 according to the first embodiment includes the insulating plate 80. However, alternatively, the insulating plate 80 may be absent in a case in which insulation of the bus bar 30 and the case 40 is secured such as in a case in which the cover 50 is constituted by an insulator.

(Second Embodiment)

Figure 7:
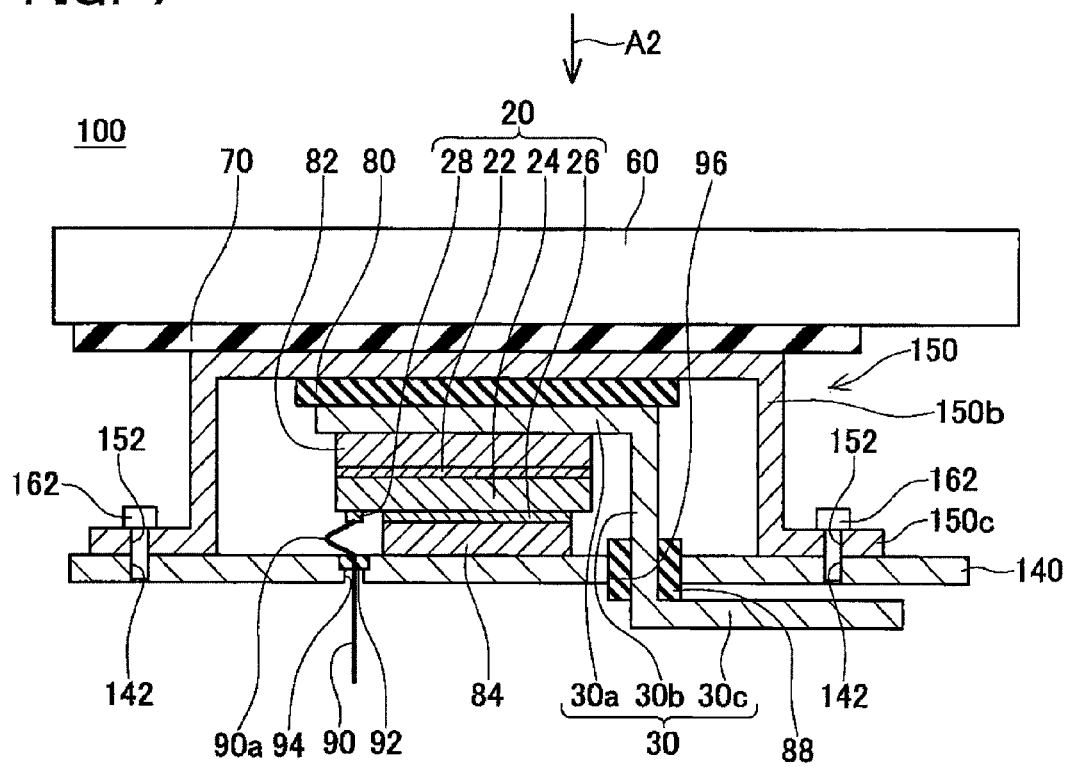
FIG. 7 is a schematic cross-sectional view of a semiconductor module 100 according to a second embodiment.
Figure 8:
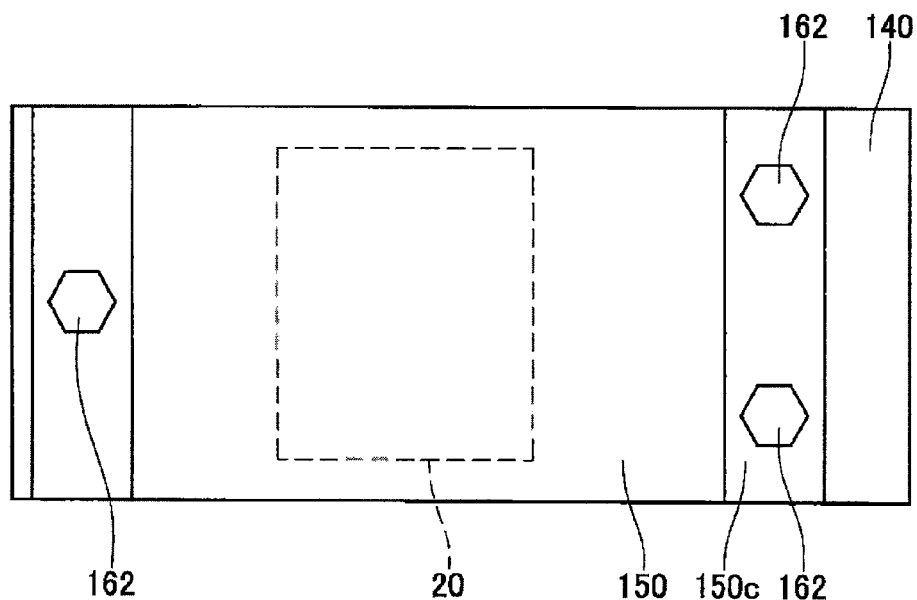
FIG. 8 is a diagram showing a positional relationship among a semiconductor device 20, a cover 150, a case 140, and screws 162 when the semiconductor module 100 is viewed along an arrow A2 in FIG. 7.

Next, a semiconductor module 100 according to a second embodiment shown in FIGS. 7 and 8 will be described. The semiconductor module 100 according to the second embodiment has the same configuration as the semiconductor module 10 according to the first embodiment with the exception of the case 40 and the cover 50. Note that, in FIGS. 7 to 8, members configured similarly to those of the first embodiment are denoted by the same reference characters as in the first embodiment.

In the semiconductor module 100 according to the second embodiment, a case 140 does not include the cylindrical portion. In other words, the case 140 is constituted solely by a flat plate portion. Three screw holes 142 are formed on the case 140.

In the semiconductor module 100 according to the second embodiment, a side wall portion 150b of a cover 150 is formed in an approximately rectangular shape. In addition, a flange 150c is formed in the side wall portion 150b. Through holes 152 are formed on the flange 150e.

Screws 162 are fastened to the screw holes 142 of the case 140 through the through holes 152 of the cover 150. Three screws 162 fix the cover 150 to the case 140 and pressurize a laminated body between the cover 150 and the case 140.

As described above, since a semiconductor device 20 is fixed to peripheral members thereof by pressurization, the semiconductor module 100 according to the second embodiment has a long life. In addition, in the semiconductor module 100, wirings to a source electrode 26 and a gate electrode 28 of the semiconductor device 20 are extracted to a lower side of the case 140. Therefore, external wirings can easily be installed.

Moreover, while a MOSFET has been described as the semiconductor devices according to the first and second embodiments shown above, configurations of the embodiments described above are applicable to various semiconductor devices such as an IGBT and a diode.

While preferred embodiments have been described using specific terms, such description is for illustrative purposes only and is not intended to limit the scope of the following claims. The techniques described in the claims include various modifications and changes made to the specific embodiments illustrated above. The technical elements described in this specification or in the drawings exhibit technical utility singly or in various combinations and are not limited to the combinations recited in the claims as filed. Moreover, the techniques illustrated in this specification or in the drawings simultaneously attain a plurality of purposes, and attaining one of the purposes per se offers technical utility.

The invention claimed is:

1. A semiconductor module, comprising:
   a semiconductor device comprising:
      a semiconductor substrate,
      a first electrode formed on one surface of the semiconductor substrate, and
      a second electrode formed on a surface of the semiconductor substrate opposite to the one surface;
   a first electrode plate being in contact with the first electrode, a second electrode plate being in contact with the second electrode, a cylinder encompassing the semiconductor device and the second electrode plate, the cylinder being fixed to the first electrode plate, a first thread groove is formed on one of an outer peripheral surface or an inner peripheral surface of the cylinder;

a cover on which a second thread groove is formed, the cover being fixed to the cylinder by an engagement of the first thread groove and the second thread groove, and the cover pressurizing the second electrode plate and the semiconductor device via an insulating member for the cover; and a first wiring member extending outward from a space between the first electrode plate and the cover, wherein one end of the first wiring member is connected to the second electrode plate and another end of the first wiring member penetrates the first electrode plate at a first penetration region and is insulated from the first electrode plate at the first penetration region;

wherein the first electrode plate, the semiconductor device, and the second electrode plate are fixed with each other by an application of a pressure to the first electrode plate, the semiconductor device, and the second electrode plate by fastening the first thread groove and the second thread groove.

2. A semiconductor module of claim 1, further comprising a cooler fixed to the cover via an insulating member for cooler.

3. A semiconductor module of claim 1, wherein the semiconductor device further comprises a third electrode formed on the one surface of the semiconductor substrate, and the semiconductor module further comprises a second wiring member connected to the third electrode and the second wiring member penetrates the first electrode plate at a second penetration region and is insulated from the first electrode plate at the second penetration region.

* * * * *